United States Patent [19]

Brzozowski et al.

[11] Patent Number: 5,194,693

[45] Date of Patent: Mar. 16, 1993

[54] MACHIEN MODULE CONNECTING MECHANISM

[75] Inventors: Joseph C. Brzozowski, Fairfield; Russell W. Holbrook, Middlebury; Valdimir V. Pirc, Norwalk; Derek S. Scholefield, Stamford, all of Conn.

[73] Assignee: Pitney Bowes Inc., Stamford, Conn.

[21] Appl. No.: 779,776

[22] Filed: Oct. 21, 1991

[51] Int. Cl.$^5$ .............................................. H05K 5/02
[52] U.S. Cl. ..................................... 174/50; 312/111; 361/394
[58] Field of Search ................... 174/50; 361/393, 394, 361/396; 312/111

[56] References Cited

U.S. PATENT DOCUMENTS

| | | | |
|---|---|---|---|
| 3,995,923 | 12/1976 | Shell | 312/111 |
| 4,826,263 | 5/1989 | Speraw | 312/111 |
| 4,994,940 | 2/1991 | Thouvenin et al. | 361/396 |
| 5,082,072 | 1/1992 | Dolan et al. | 177/4 |

*Primary Examiner*—Harold Broome

*Attorney, Agent, or Firm*—Charles G. Parks, Jr.; Melvin J. Scolnick

[57] ABSTRACT

There is disclosed a connecting mechanism for securing together two modules of a mailing machine which are sufficiently heavy and bulky that one person could not manipulate the entire machine for installation or service if the machine were constructed as one unit. Each module is mounted on a separate base plate, one of which has outwardly projecting legs extending from a side face of the base plate and the other of which has inwardly extending recesses which open at the side face thereof adapted to abut the side face of the first mentioned base plate. The legs have raised bosses adjacent the ends thereof which are received within L-shaped recesses formed in a latching bar mounted adjacent the ends of the recesses in the second mentioned base plate, the bar being laterally movable from an unlocked position in which the raised bosses can enter the openings of the L-shaped recesses to a locked position in which the raised bosses are locked within a slightly tapered locking portion of the L-shaped slots to pull the base plates toward each other so that the abutting faces are in firm contact with each other.

10 Claims, 5 Drawing Sheets

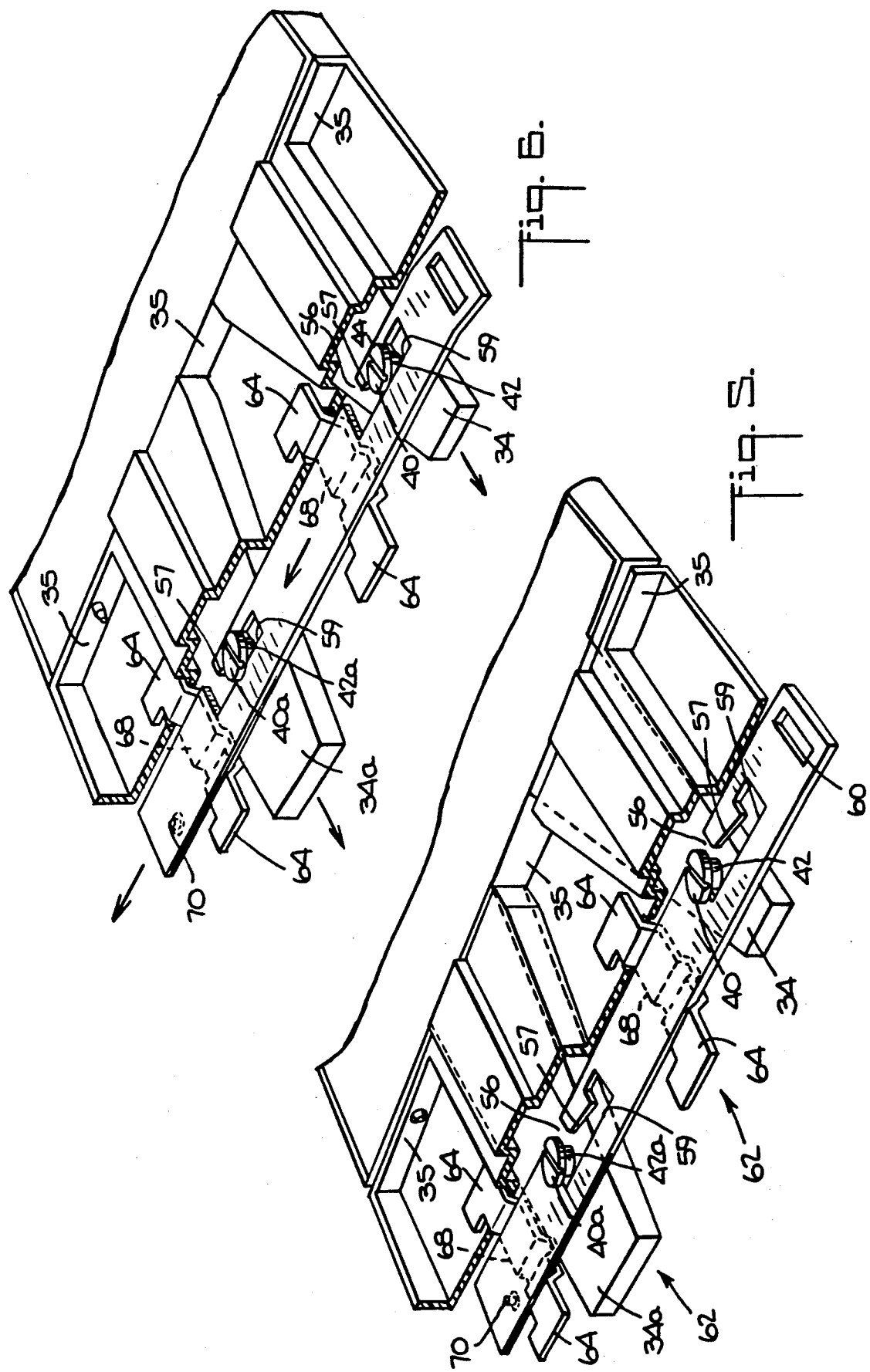

MACHIEN MODULE CONNECTING MECHANISM

BACKGROUND OF THE INVENTION

The present invention relates generally to a high speed mailing machine of the type that performs a series of discrete operations on mail pieces passing through the mailing machine, and more particularly to a mailing machine that is constructed as a pair of units or modules which are manufactured and shipped to an operational site separately and then assembled and installed at the site.

In a typical high speed mailing machine, mail pieces in the form of envelopes are fed seriatim along a feed deck by suitable feeding devices past a plurality of working stations which usually include an envelope flap opening device, a flap moistening device, a flap closing and sealing device, a postage meter, and a stacking device. The mailing machine may also include a scale for weighing the mail pieces before they pass through the postage meter. A principal advantage of such machines is that they can perform the aforementioned operations on mail pieces at a very high rate of speed, in the order of three to four mail pieces per second, and therefore are very attractive to high volume mailers such as credit institutions, telephone companies, telemarketing operations, etc.

One of the major problems with such machines is that they are large, bulky, heavy and difficult to handle during manufacture, shipping, installation and service. A typical mailing machine of the type with which the present invention is concerned is approximately four feet long, 18 inches in depth and 12 inches high, and weighs about 100 hundred pounds. It is obvious that a machine of these dimensions and weight will present considerable difficulties and obstacles to easy handling during all stages of the manufacture, transportation and installation of the machine. In particular, the efficiency of the manufacturing process is limited because of the fact that the entire machine must be assembled onto a single base, which requires a dedicated assembly line for the entire machine. With regard to transportation, the machine must often be specially packaged, perhaps crated, to assure that it does not sustain any damage, and of course, special care must be exercised in handling and moving the machine. Further, the installation of such a machine at the operational site would require at least two service people to unpack the machine and perform the other necessary tasks to render it operational. Finally, it is often difficult to service machines of this type because of their large size and weight, makes then difficult to handle on site when internal repairs are required. All of these disadvantages and limitations are highly detrimental to the cost effectiveness of the machine and should be eliminated whenever and to the fullest extent possible.

An obvious solution to the foregoing problem is to build a mailing machine of the type described above as separate units or modules which are then transported to the operational site separately and connected together to form a unitary machine. Such modular construction would increase the efficiency of the manufacturing process by allocating the assembly of each module to a different line. Handling and transportation becomes much easier since the machine modules are only half the size and weight of the entire machine (assuming there are two modules to the machine), thereby simplifying the packaging problem and reducing overall shipping costs. Also, it now becomes possible for a single service person to handle the modules with regard to unpacking and installing them at the operational site, thereby greatly reducing the installation costs. Finally, it is much easier for a single service person to handle the modules in connection with any repairs which must be made that require that the machine be moved. It will be apparent that all factors combined, the manufacture, shipping, installation and service of modular units can greatly enhance the cost effectiveness of the overall mailing machine.

It has been found that a major problem inherent in modular construction of mailing machines is the manner in which the modules are assembled and locked together. Many different types of connecting systems have been tried and discarded for one reason or another, usually that they were lacking in sufficient strength to hold the modules together securely during hundreds of thousands, if not millions, of cycles, that they did not maintain proper alignment for registration of the feed paths of the modules, that they required partial disassembly of the modules to effect the connecting procedure, or that they involved many parts and were rather difficult and complex for the service person to handle effectively on site. It soon became apparent that what was needed was a connecting mechanism that overcame these problems and provided the required strength, maintained proper alignment of the modules, did not require any disassembly of the module to use and was easy to manipulate.

SUMMARY OF THE INVENTION

The present invention is intended to obviate if not completely eliminate the foregoing problems and disadvantages by providing a connecting system for a pair of mailing machine modules having the features and advantages of construction and operation hereinafter described.

The present invention resides in a mailing machine constructed as a pair of modules each of which performs certain discrete operations on mail pieces which are fed seriatim through the modules, and which are normally connected together in face to face relationship to form an integral machine for performing the series of operations on the mail pieces as they pass through the modules sequentially. The present invention comprises a connecting means for connecting the modules together in a securely locked relationship which prevents either module from moving relative to the other and yet permits them to be readily separated when the need arises. In one of its broader aspects, the present invention comprises means mounted on one of the modules adjacent the face thereof adapted to abut the corresponding face of the other module, and which projects outwardly therefrom. A securing means is mounted on the outwardly projecting means. There are means mounted on the other module adjacent the aforementioned corresponding face thereof for receiving the outwardly projecting means of the first module in interfitting relationship therewith. Finally, there are locking means mounted on the other module which are movable between a locked position and an unlocked position for engaging the securing means on the outwardly projecting means of the first module in locking engagement therewith so as to hold the adjacent faces of the modules in firm contact with each other when the movable means is in the locked position, and for releasing the securing means when the movable means is in the unlocked position to permit easy separation of the modules.

In some of its more limited aspects, the outwardly projecting means is in the form of a pair of specially shaped legs, and the securing means are raised bosses carried adjacent the free end of the legs. The receiving means is a pair of recesses on the other module which are shaped to receive the legs in interfitting relationship so that a rigid connection between the modules is effected when the legs are fully inserted into the recesses. Finally, the movable means is in the form of a bar which is movable laterally of the module, and has receiving slots for the raised bosses on the legs, the slots being adapted to engage and hold the bosses when the bar is in its locked position.

A particular feature of the present invention is that the slots on the movable bar are tapered so as to effect a camming action on the raised bosses when the bar is moved from the unlocked position to the locked position so that the modules are drawn together more tightly than is possible by a service person pushing the modules together.

Having briefly described the general nature of the present invention, it is a principal object thereof to provide an improved connecting system for mailing machine modules which provides a quick, simple and secure method for securing and locking the modules together, and which is readily releasable to facilitate easily separating the modules.

Another object of the present invention is to provide an improved connecting system for mailing machine modules which secures the modules together with sufficient strength to maintain accurate alignment between the mail feed paths of both modules to assure proper tracking of mail pieces traveling from one module to the other.

Still another object of the present invention is to provide an improved connecting system for mailing machine modules which pulls the modules together more tightly than would be possible by a service person merely pushing them together manually.

A still further object of the present invention is to provide an improved connecting system for mailing machine modules which is simple and inexpensive to manufacture, is easy to manipulate and would virtually never require repair or service.

These and other objects and advantages of the present invention will become more apparent from an understanding of the following detailed description of a presently preferred embodiment of the present invention when considered in conjunction with the accompanying drawings.

BRIEF DESCRIPTION OF THE DRAWINGS

FIG. 5 is a perspective view of the locking means between the two modules with portions of the module bases broken away to show the details of construction of the locking means, the parts being shown in the positions they assume after engagement but before locking is effected.

FIG. 6 is a view similar to FIG. 5, but showing the parts of the locking means in the positions they assume when fully locked together.

FIG. 7 is a plan view of the sliding bar component of the locking means for the modules.

DETAILED DESCRIPTION OF THE INVENTION

Figure 1:
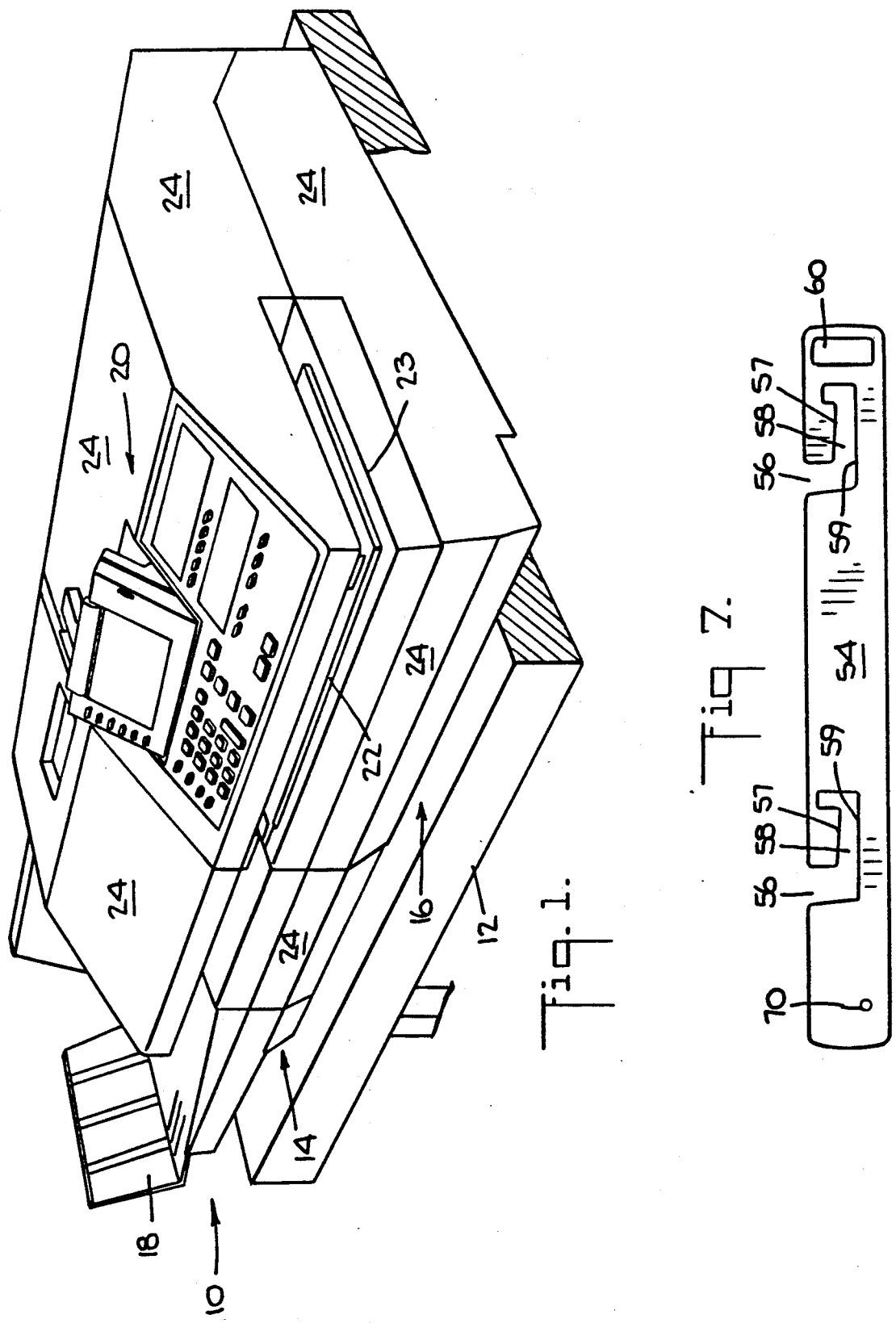
FIG. 1 is a perspective view of a modular mailing machine of the type in which the present invention is utilized, showing only the barest essential details necessary for an understanding of the invention.

Referring to FIG. 1, there is seen a mailing machine generally designated by the reference numeral 10, the machine 10 being shown resting on a suitable surface 12. The mailing machine 10 includes two modules, a feeder-sealer module generally designated by the numeral 14 and a weighing-metering module generally designated by the numeral 16. The details of construction of these modules relation to the operation thereof form no part of the present invention, and therefore are not described in full. It is sufficient for an understanding of the invention to note generally that the feeder module 14 includes a hopper 18 into which a stack of envelopes is placed, and a suitable feeding mechanism separates the envelopes seriatim and feeds them through the feeder-sealer module in which the envelopes are opened, the flaps are moistened and the envelopes are then closed and sealed. The envelopes then travel from this module to the weighing-metering module 16 in which they are weighed, the amount of postage for each envelope is calculated by a postage meter generally designated by the numeral 20, and an appropriate postage indicia showing the postage is printed on the envelopes. The feed path along which the envelopes travel commences at the stacking device 18 on the feeder-sealer module 14, extends through both modules, passes across the weighing platform 22 of the scale in the module 16, and terminates at the discharge end 23 shown at the right side of the module 16 as viewed in FIG. 1. It will be apparent, of course, that both modules 14 and 16 are covered with suitable top, front, rear and side housing panels, all of which are designated generally by the numeral 24 in FIG. 1, so as to enclose and protect the operating components of the modules.

Figure 2:
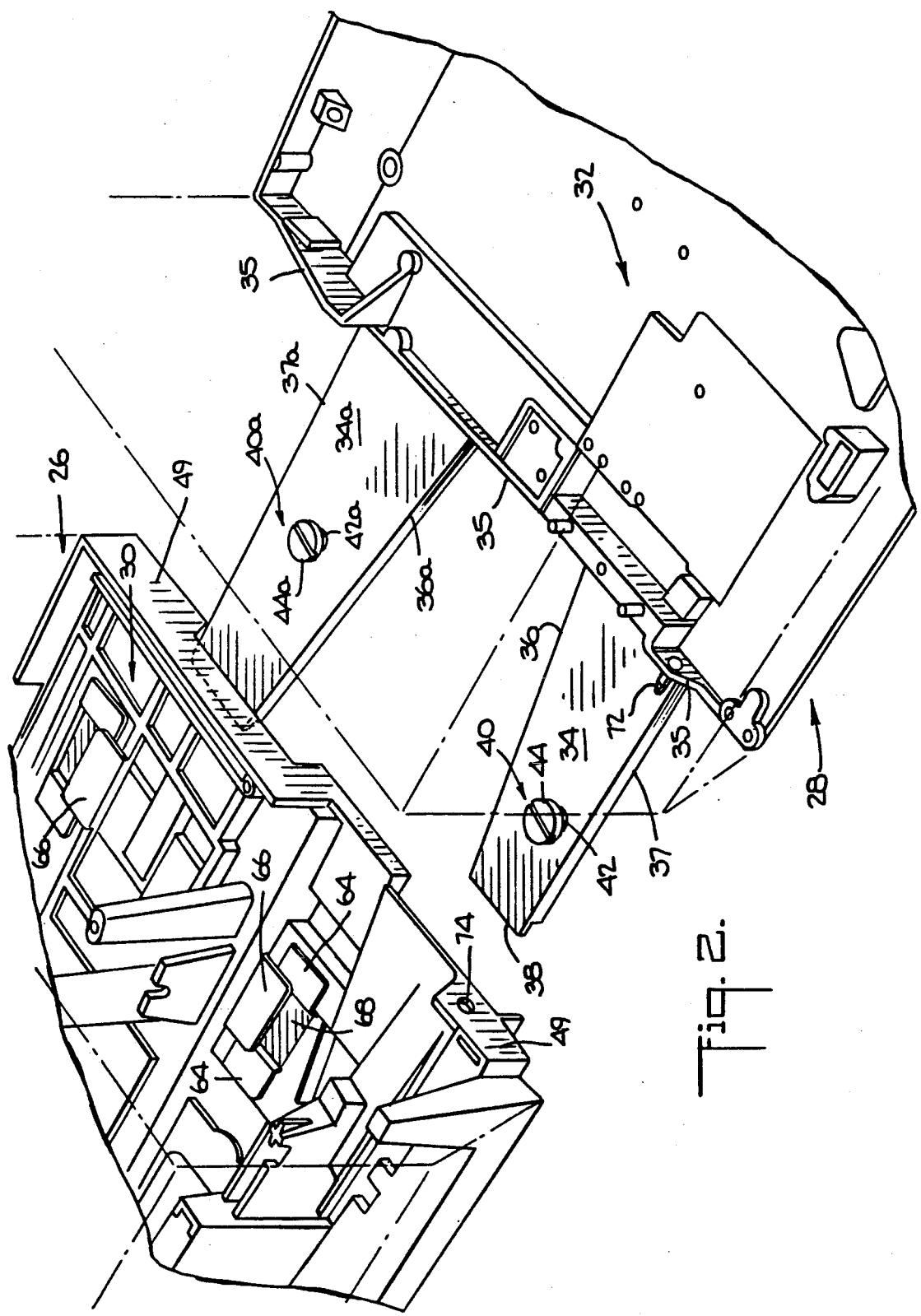
FIG. 2 is a fragmentary perspective view of the bases of the modules shown in FIG. 1 in disassembled relationship, but about to be assembled together.
Figure 3:
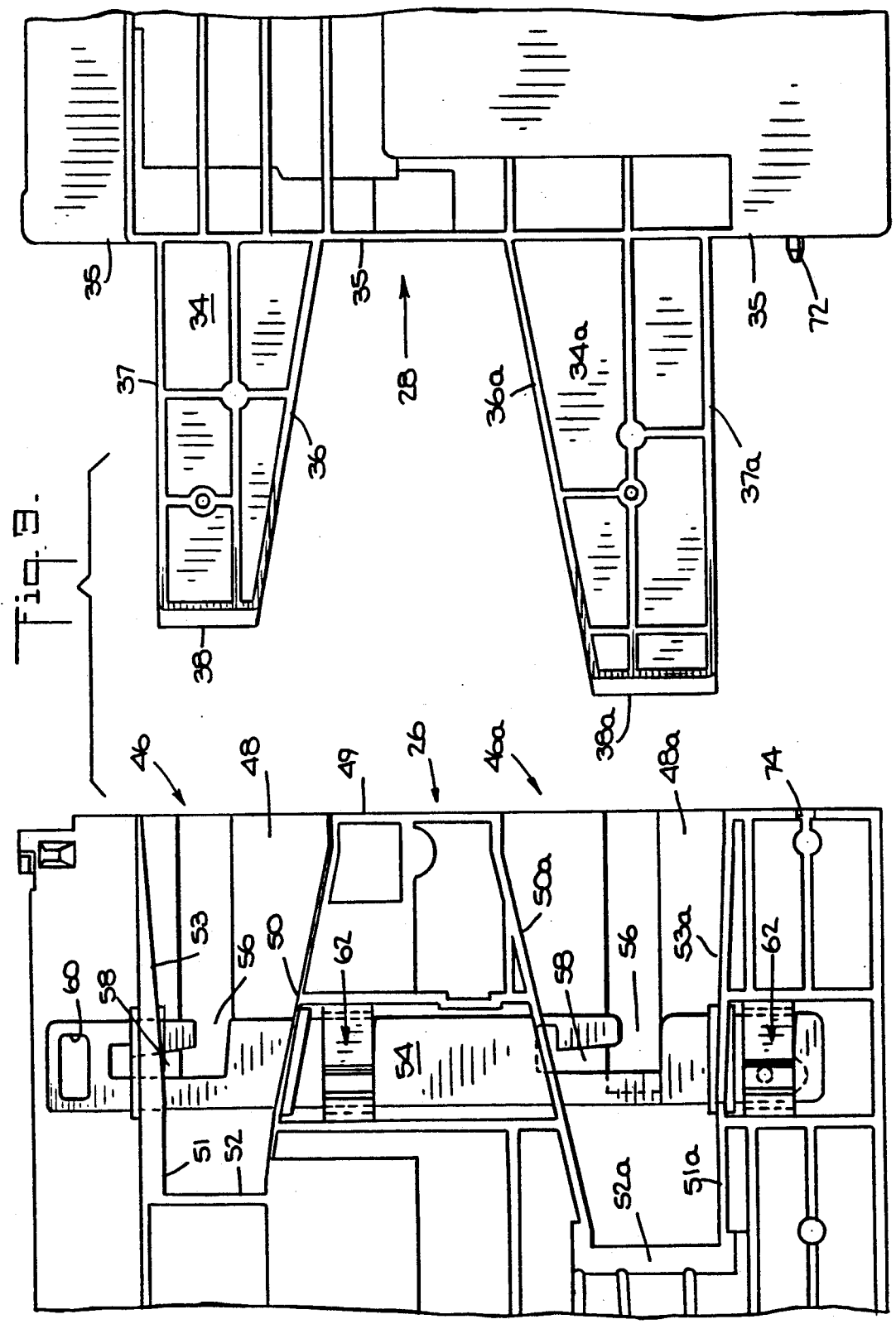
FIG. 3 is a plan view of the underside of the module bases shown in FIG. 1, again is a disassembled relationship.

Referring now to FIGS. 2 and 3, the feeder-sealer module 14 includes a base plate generally indicated by the reference numeral 26, and the weighing-metering module 16 includes a base plate 28. Other than the details of the connecting means for the two modules described in detail below, it is sufficient to note only that the bases 26 and 28 are of a size to underlie the modules 14 and 16 respectively, and are provided with a plurality of mounting means, generally indicated by the reference numeral 30 and 32 for the bases 26 and 28 respectively, on which certain of the components of the modules 14 and 16 are mounted and secured. The specific manner in which the module components are secured to the mounting means forms no part of the present invention.

The base 28 is provided with at least one, and preferably two as shown, outwardly projecting means in the form of a pair of legs 34 and 34a which are formed integrally with the adjacent edge 35 of the base 28. Other ways of connecting the legs 34 to the base are possible within the scope of the invention, but it is believed that since the base 34 is formed of metal, the greatest strength is obtained by forming the legs integrally with the base. As is clearly apparent, the side edges 36 and 36a of the legs 34 are angled toward the longitudinal axis of the legs 34 and 34a, whereas the opposite side edges 37 and 37a are parallel to the longitudinal axis of the legs so that the legs are tapered downwardly toward the free ends 38 and 38a thereof for a purpose to be made clear herein below. It will also be seen from FIGS. 2 and 3 that the leg 34a is slightly longer than the leg 34 so as to act as a guide for joining the two bases together in a manner further described below.

Each of the legs 34 and 34a is provided with a securing means which may be any form of raised boss or projection generally designated by the numerals 40 and 40a capable of being grasped by another part, and in the form of the invention disclosed is a screw threaded into the legs 34 and 34a and having a shank 42 and 42a and an enlarged head 44 and 44a respectively. Each of the screws are connected to the legs adjacent the center thereof but spaced slightly closer to the tapered ends 36 than the other end.

Figure 4:
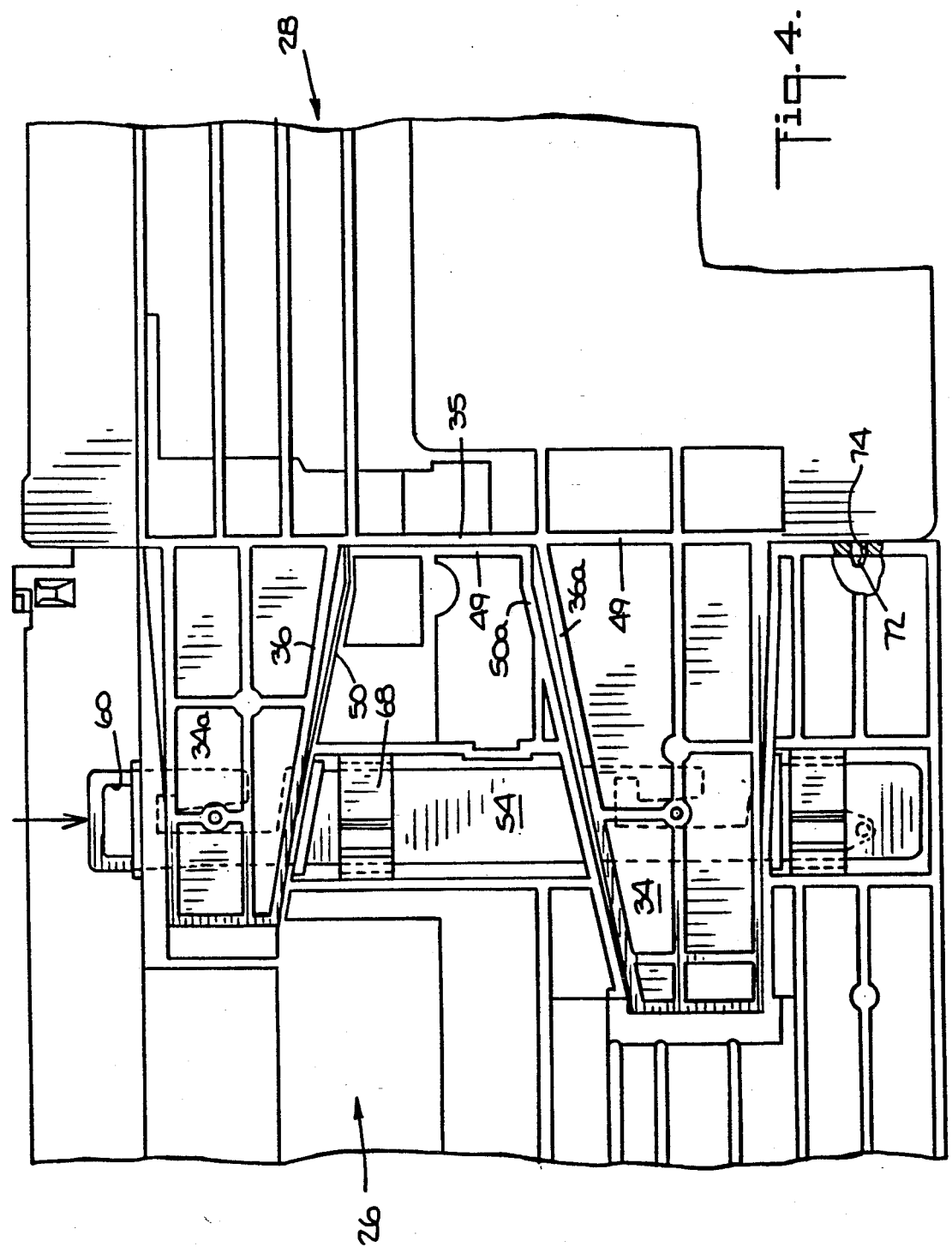
FIG. 4 is a plan view of the underside of the module bases but shown in their assembled relationship and locked together.

As best seen in FIG. 3, the other base plate 26 is provided with a receiving means generally designated by the numerals 46 and 46a for the outwardly projecting means of the base plate 28, the receiving means having a shape which is complimentary to the shape of the outwardly projecting means. Thus, in the form of the invention disclosed, the base plate 26 is provided with a pair of recesses 48 and 48a commence as the face 49 of the base plate 26 which is adapted to abut the corresponding face 35 of the base plate 28 when the two base plates are securely locked together in the manner described below. The recesses 48 and 48a have side walls 50 and 50a which are angled toward each other in substantially the same manner as the walls 36 and 36a of the legs 34 and 34a, although the angle of these side walls with respect to the horizontal axis of the bases 26 and 28 is not the same; as best seen in FIG. 4, the side walls 36 and 36a are angled slightly less than the side walls 50 and 50a to allow for manufacturing tolerances to assure that the legs 34 and 34a will always extend fully into the recesses 48 and 48a. The opposite walls 51 and 51a of the recesses 48 and 48a are parallel to the longitudinal axis of the base 26 along an inner portion of their length but have a very slight outward taper along the remainder of their length as indicated by the numerals 53 and 53a, this slight outward taper of the wall portions 53 and 53a being for the same purpose as mentioned above for the walls 50 and 50a. The effect of this configuration is to provide a tapered configuration to the recesses 48 and 48a in the direction of rear walls 52 and 52a corresponding generally but not precisely to the tapered configuration of the legs 34 and 34a, so that the legs 34 and 34a fit into the recesses 48 and 48a in an interfitting relationship, as best seen in FIG. 4 Thus, when the legs 34 and 34a in fully engaged within the recesses 48 and 48a and are securely locked together in the manner hereinafter described, the adjacent faces 35 and 49 are drawn together in a tight abutting relationship to as to form a very rigid unified frame between the two module base plates which is sufficient to resist any tendency for the plates to wobble or move angularly with respect to each other.

In order to accomplish the foregoing, the base plate 26 is provided with a latching member for engaging the securing means 40 and 40a on the legs 34 and 34a. The latching member is a form of bayonet slot which engages with and locks onto the shanks 42 and 42a of the screws 40 and 40a. Thus, as best seen in FIGS. 3 and 7, the locking member is in the form of an elongate bar 54 which extends over substantially the entire depth of the base plate 26, and is provided with a pair of right angle slots each having an entrance portion 56 and a latching portion 58. The side walls 57 are disposed at a convergent angle with respect to the longitudinal axis of the latching bar 54, whereas the walls 59 are parallel with the longitudinal axis of the latching bar, so as to effect a camming action on the shafts 42 and 42a of the screws 40 and 40a in a manner more fully described below.

One end of the bar is provided with an opening 60 to facilitate grasping the bar 54 for movement as hereinafter described in more detail below. The bar 54 is movably mounted on the base plate 26 by means of a pair of brackets generally designated by the numeral 62. As best seen in FIGS. 2, 5 and 6, each bracket has a pair of end wings 64 which are positioned over the upper surface of the base plate 26 and secured thereto by tabs 66 (see FIG. 2). Between the wings 64 the bracket has a depressed portion 68 which extends beyond the opposite surface of the base plate 26 just enough to enclose the latching bar 54 and hold it in sliding relationship against the underside of the base plate 26. The latching bar 54 carries a suitable abutment 70 adjacent the end thereof opposite the grasping opening 60 which abuts the frame 26 when the latching bar 54 is moved to the unlocked position to prevent the latching bar from moving beyond the normal unlocked position when the base plates 26 and 28 are separated.

In order to assist in the proper alignment of the base plates 26 and 28 during assembly of the modules at the operational site, a locating pin 72 is mounted on the base plate 28 adjacent the front end of the face 35, the pin being slightly tapered at the free end thereof. A locating hole 74 is provided in the corresponding face 49 of the base plate 26. As is apparent from FIG. 4, when the modules are nearly pushed together, the pin 72 enters the hole 74 to effect proper front to rear registration of the feed paths of the modules 14 and 16.

The operation of the latching mechanism to lock the two modules together will now be described. After the modules 14 and 16 have been unpacked at the operational site and serviced in whatever manner is required, they are placed on the supporting surface 12 in side by side relationship. The service person would then push them together by first guiding the longer leg 34a of the weighing-metering module 16 into the corresponding recess 46a of the feeder-sealer module 14, as shown in FIG. 2. The modules are then pushed possible by the service person which under normal circumstances is the point where the shafts 42 and 42a of the screws 40 and 40a respectively enter the entrance slots 56 of the latching bar 54, as seen in FIG. 5. At about this point, the aligning pin 72 enters the hole 74. The latching bar 54 is then pushed toward the rear end of the modules so that the shafts 42 and 42a begin to slide along the latching portion 58 of the slots which prevents the shafts 42 and 42a from disengaging from the slots. However, due to the convergent angle of the walls 57 of the latching portion 58 of the slots, the shafts 42 and 42a are in effect cammed toward the opposite straight walls 59 thereby drawing the legs 34 and 34a further into the recesses 48 and 48a and bringing the faces 35 and 49 of the base plates 28 and 26 into firm abutting engagement. When the shafts 42 and 42a are firmly wedged between the walls 57 and 59 of the latching portion 58 of the slots, the latching bar 54 cannot move any further and the two modules are securely locked together, as shown in FIG. 6.

In order to release the latching mechanism to permit the modules 14 and 16 to be separated, it is only necessary to pull the latching bar 54 toward the front of the modules until the abutment member 70 stops further movement. The shafts 42 and 42a will then be aligned with the entrance portion 56 of the slots and the modules can easily be separated by pulling one away from the other.

What is claimed is:

1. In a mailing machine having a pair of modules, each of said modules having means for performing discrete operations on mail pieces fed seriatim therethrough, said modules normally being connected together in abutting face to face relationship for forming an integral mailing machine for performing a series of operations of the mail pieces as they are fed through said modules sequentially, connecting means for connecting said modules together in locked relationship and for permitting said modules to be separated, said connecting means comprising:

A. means mounted on one of said modules adjacent the face thereof adapted to abut the corresponding face of the other module, said means projecting outwardly therefrom,
  B. securing means mounted on said outwardly projecting means,
  C. means mounted on said other module adjacent said corresponding face of said other module for receiving said outwardly projecting means of said one module in interfitting relationship therewith, and
  D. locking means movably mounted on said other module between a locked position and an unlocked position for engaging said securing means in locking engagement therewith when said locking means is in said locked position and for releasing said securing means when said movable means is in said unlocked position,
  whereby said modules are securely and rigidly connected together when said movable means is in said locked position but can be separated when said movable means is in said unlocked position.

2. In a mailing machine as set forth in claim 1 wherein said outwardly projecting means on said one module comprises at least one elongate leg, and
said securing means comprises a raised boss mounted on said leg adjacent the free end thereof.

3. In a mailing machine as set forth in claim 2 wherein said receiving means on said other module comprises a recess formed in said other module and shaped to receive said elongate leg in substantial interfitting relationship therewith.

4. In a mailing machine as set forth in claim 3 wherein said movable means includes latching means for engaging said raised boss in locking relationship therewith when said movable means is moved from said unlocked position to said locked position.

5. In a mailing machine as set forth in claim 1 wherein each of said modules includes a base plate, each of which includes a face which is adapted to be brought into firm contact with the corresponding face of the other base plate, and further wherein
  said outwardly projecting means comprises a pair of elongated legs mounted on one of said base plates adjacent said face and in spaced apart parallel relationship with each other,
  said securing means comprises a raised boss mounted on each of said legs adjacent the free end thereof, and
  said receiving means comprises a corresponding pair of recesses formed in the other base plate and opening toward said corresponding face of said other base plate and being in spaced apart parallel relationship with each other to receive said legs in substantial interfitting relationship.

6. In a mailing machine as set forth in claim 5 wherein said locking means comprises an elongate bar mounted on said other base plate for movement between an unlocked position and a locked position in a direction perpendicular to the direction in which said legs are moved into said recesses, said bar having latching means thereon for engaging said securing means when said bar is in said unlocked position and said legs are substantially fully positioned within said recesses, and for locking with said securing means when said legs are fully received within said recesses and said bar is moved to said locked position.

7. In a mailing machine as set forth in claim 6 wherein said latching means comprises means on said bar defining a pair of recesses shaped to receive said raised bosses when said bar is in said unlocked position and to engage said bosses in locking engagement therewith when said bar is moved to said locked position.

8. In a mailing machine as set forth in claim 7 wherein said means defining said recesses includes means for effecting a slight camming action on said raised bosses whereby said outwardly projecting means is drawn into said receiving means with sufficient force to bring said opposed faces of said base plates into firm contact with each other.

9. In a mailing machine as set forth in claim 7 wherein said means defining said pair of recesses comprises a pair of L-shaped slots in said elongate bar, each of said slots having an entrance portion facing outwardly toward said corresponding face of said other base plate and aligned with said raised bosses on said legs, and a locking portion connecting with said entrance portion and perpendicular therewith into which said raised bosses enter when said elongate bar is moved from said unlocked position to said locked position.

10. In a mailing machine as set forth in claim 9 wherein said means defining said pair of recesses also includes means for effecting a slight camming action on said raised bosses, said means comprising the wall of said locking portion of each of said L-shaped slots which faces toward said entrance portion being angled inwardly with respect to the opposite wall of said locking portion so that said raised bosses are drawn toward said opposite wall by said angled wall when said bar is moved from said unlocked position to said locked position where said raised bosses become wedged in said locking portion of said slots, whereby said outwardly projecting means are drawn into said receiving means with sufficient force to bring said opposed faces of said base plates into firm contact with each other.

* * * * *